United States Patent
Ito

(10) Patent No.: US 7,703,889 B2
(45) Date of Patent: Apr. 27, 2010

(54) PRINTED WIRING BOARD AND ELECTRIC DEVICE USING THE SAME

(75) Inventor: Hirosumi Ito, Nagoya (JP)

(73) Assignee: Brother Kogyo Kabushiki Kaisha, Aichi-Ken (JP)

(*) Notice: Subject to any disclaimer, the term of this patent is extended or adjusted under 35 U.S.C. 154(b) by 625 days.

(21) Appl. No.: 11/113,459

(22) Filed: Apr. 25, 2005

(65) Prior Publication Data

US 2005/0237364 A1  Oct. 27, 2005

(30) Foreign Application Priority Data

Apr. 26, 2004  (JP) ............................ P2004-130061

(51) Int. Cl.
B41J 2/14   (2006.01)
B41J 2/16   (2006.01)
B41J 2/05   (2006.01)

(52) U.S. Cl. .......................................... 347/50; 347/58

(58) Field of Classification Search ............. 347/58–59, 347/148, 50; 438/21; 257/773, 780, 786
See application file for complete search history.

(56) References Cited

U.S. PATENT DOCUMENTS

| 5,097,101 | A | 3/1992 | Trobough |
| 5,252,781 | A | 10/1993 | Shirai et al. |
| 5,517,756 | A | 5/1996 | Shirai et al. |
| 6,040,529 | A * | 3/2000 | Takeshita et al. ............ 174/254 |
| 2003/0112298 | A1* | 6/2003 | Sato et al. ..................... 347/68 |
| 2004/0060969 | A1* | 4/2004 | Imai et al. ............. 228/180.21 |

FOREIGN PATENT DOCUMENTS

| JP | 01-094696 | | 4/1989 |
| JP | 01209786 A | * | 8/1989 |
| JP | U-4-33550 | | 3/1992 |
| JP | 04-354398 | | 12/1992 |
| JP | 5109457 | | 4/1993 |
| JP | 08-162731 | | 6/1996 |
| JP | 08-236937 | | 9/1996 |
| JP | 10-200217 | | 7/1998 |
| JP | 11-220247 | | 8/1999 |
| JP | 2000-012991 | | 1/2000 |

* cited by examiner

*Primary Examiner*—Matthew Luu
*Assistant Examiner*—Lisa M Solomon
(74) *Attorney, Agent, or Firm*—Frommer Lawrence & Haug LLP

(57) ABSTRACT

There is disclosed a printed wiring board comprising: an electrically insulating flexible layer which has on one of its opposite sides a protrusion which forms a corresponding recess on the other side of the flexible layer; an electrically conducting layer formed on the protrusion; and a wire formed on the flexible layer, connected to the conducting layer, and extending in a direction. The conducting layer has a shape long in the direction of extension of the wire.

21 Claims, 12 Drawing Sheets

MAIN SCANNING DIRECTION    SUB SCANNING DIRECTION

PRINTED WIRING BOARD AND ELECTRIC DEVICE USING THE SAME

INCORPORATION BY REFERENCE

The present application is based on Japanese Patent Application No. 2004-130061, filed on Apr. 26, 2004, the content of which is incorporated herein by reference.

BACKGROUND OF THE INVENTION

1. Field of the Invention

The invention relates to a printed wiring board for transmitting drive signals, and an electric device using such a printed wiring board.

2. Description of Related Art

Unexamined Japanese Utility Model Application No. 4-33560 discloses an inkjet printer having an inkjet head unit including an actuator unit in the form of an inkjet printhead comprising a plurality of piezoelectric patches for pressurizing ink in a plurality of pressure chambers in the printhead, and a flexible printed wiring board or a flexible printed circuit board (FPC) comprising a base turn and a conductor pattern comprising a plurality of conductors each consisting of a conducting layer or terminal and a wire, formed on a side of the base film. Each terminal is disposed to be opposed to the piezoelectric patches. On the side of the base film which is opposed to the printhead, there is further formed an insulating film to cover the conductor pattern, except places where the terminals are disposed and therearound. Each of the terminals has a portion protruding toward the piezoelectric patches, and this protrusion is pressed against an outermost one of the piezoelectric patches so that each of the conducting layers of the FPC and the outermost piezoelectric element are electrically connected.

In the conventional arrangement disclosed in the above-mentioned publication, the insulating film is not formed around the terminals, causing a problem that the conducting layers tend to separate from the base film upon formation of the protrusions in the terminals of the conducting layers on the FPC by pressing, due to the stress imposed on a bonding surface between the base film and the terminals.

SUMMARY OF THE INVENTION

The present invention has been developed in view of the above-described situations and it is an object of the invention to provide a printed wiring board capable of preventing the separation of conducting layers, and an electric device, such as a head unit of a printer, using such a printed wiring board.

To attain the above object, the invention provides a printed wing board comprising an electrically insulating flexible layer which has on one of its opposite sides a protrusion which forms a corresponding recess on the other side of the flexible layer; an electrically conducting layer formed on the protrusion; and a wire formed on the flexible layer, connected to the conducting layer, and extending in a direction. The conducting layer has a shape long in the direction of extension of the wire.

By this arrangement, a separation of the conducing layer from the flexible layer upon formation of the protrusion or recess in the conducting layer formed on the flexible layer is prevented.

According to another aspect of the invention, there is provided an electric device comprising: an actuator unit which includes a plurality of electrodes formed thereon; and a printed wiring board comprising: an electrically insulating flexible layer which has on one of its opposite sides a plurality of protrusions which form a plurality of corresponding recesses on the other side of the flexible layer; a plurality of electrically conducting layers formed on the respective protrusions; a plurality of wires formed on the flexible layer, connected to the respective conducting layers, and extending in a direction; and each of the conducting layers having a shape long in the direction of extension of the wires.

In the electric device according to this aspect of the invention, a separation of the conducing layer from the flexible layer upon formation of the protrusion or recess in the conducting layer formed on the flexible layer is prevented.

An example of the actuator unit is a recording head such as a printhead which may be, for instance, a thermal head or inkjet head, a magnetic head which may be used, for instance, in a radio-cassette player/recorder or HDD, and an optical head for a CD or DVD player/recorder. Other examples of the actuator unit are a reading unit, and an image sensor such as of a scanner or digital camera, namely, CMOS sensor, CCD sensor, and the like. When the actuator unit constitutes a printhead, the electric device may be a head unit including the printhead. The printhead usually has a plurality of printing elements each of which includes an actuating portion which is deformable or of other types. When the actuator unit constitutes an inkjet printhead, the inkjet printhead may be of any type, for instance, thermal, piezoelectric, and electrostatic type. The printing element of a piezoelectric inkjet printhead comprises an actuating portion, a pressure chamber and a nozzle.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 7A is an enlarged view of a portion of an actuator unit as encompassed by a chain line in FIG. 6, while

DETAILED DESCRIPTION OF PREFERRED EMBODIMENTS

Hereinafter, there will be described presently preferred embodiments of the invention, by referring to the accompanying drawings.

Figure 1:
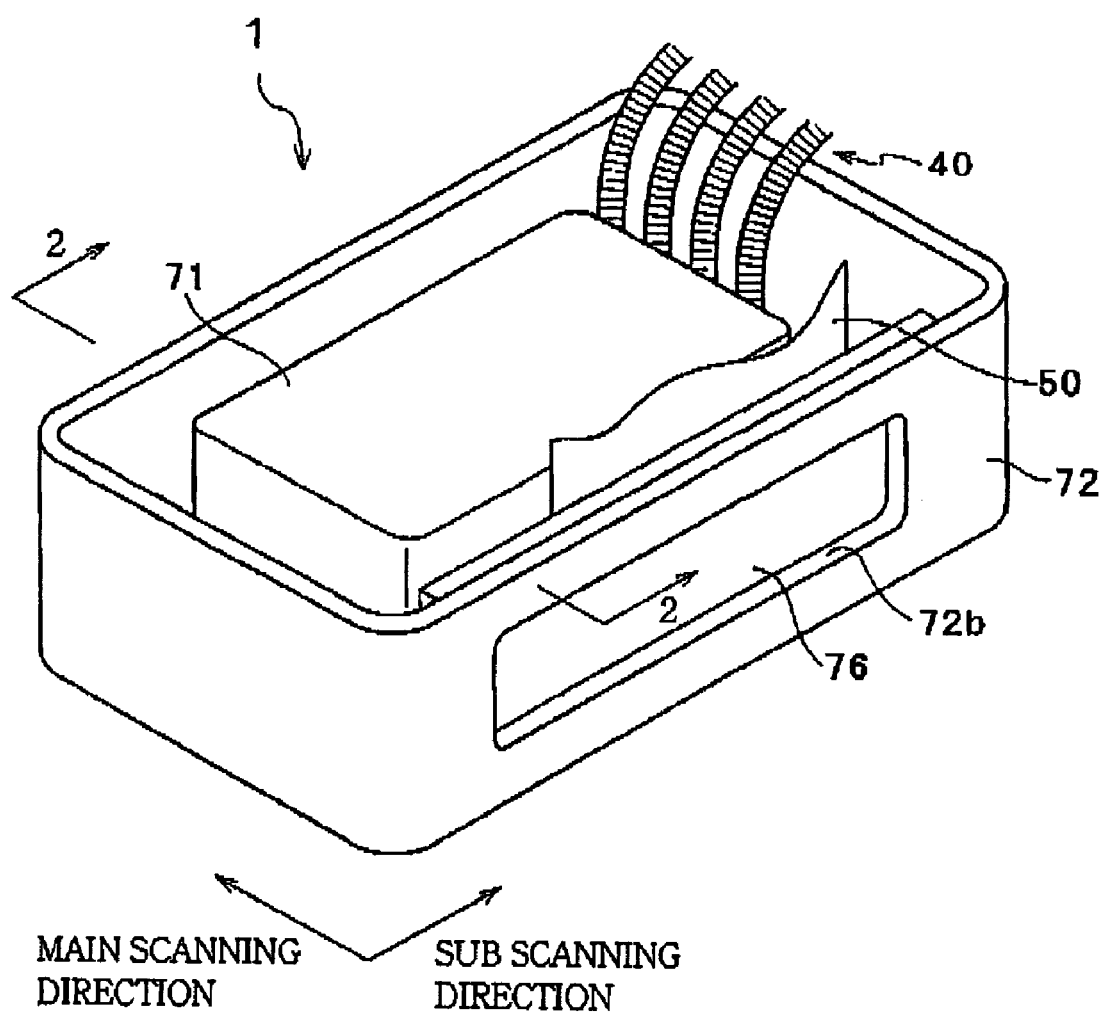
FIG. 1 is a perspective external view schematically showing an inkjet head unit according to a first embodiment of the present invention.
Figure 2:
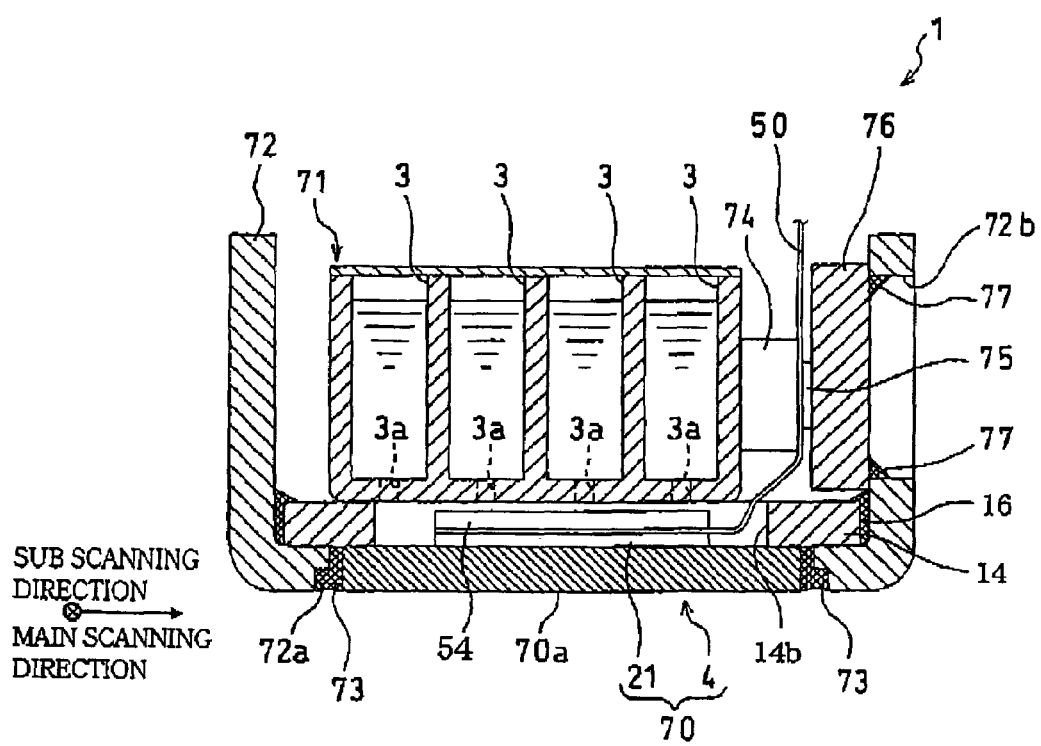
FIG. 2 is a cross-sectional view of the head unit of FIG. 1, taken along a line 2-2 in FIG. 1.
Figure 3:
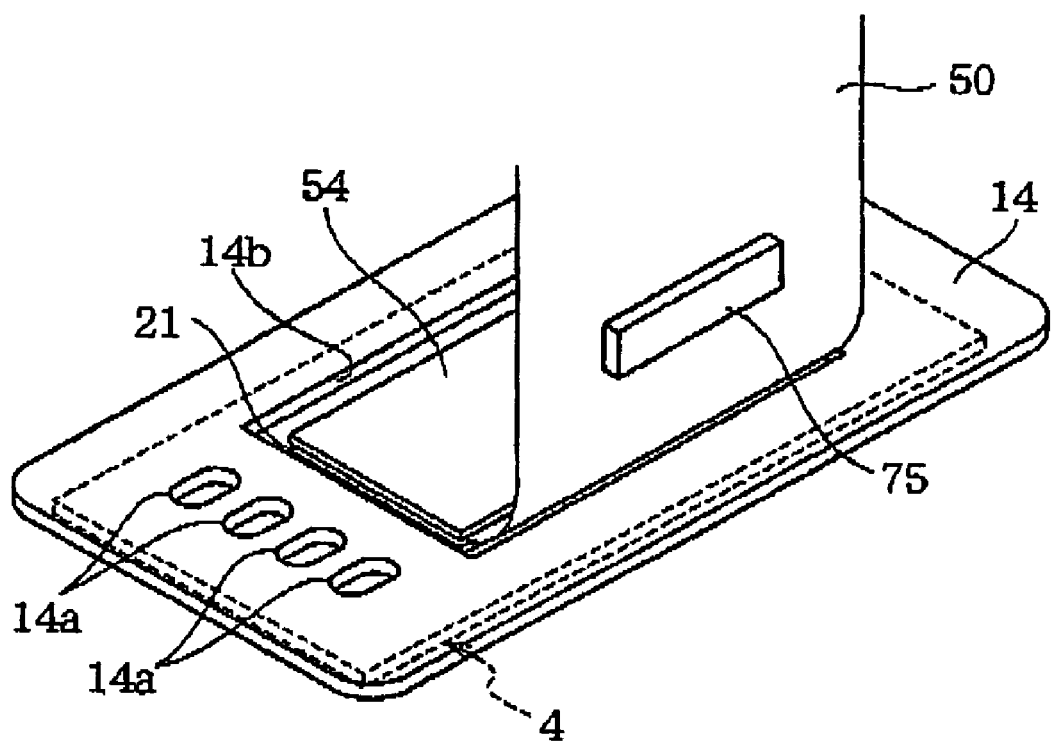
FIG. 3 is a perspective view showing a state where a reinforcing plate is bonded to a printhead of the head unit.

FIG. 1 is an external perspective view of an inkjet head unit according to a first embodiment of the invention. FIG. 2 is a cross-sectional view taken along a line 2-2 in FIG. 1, showing a state where a printhead is mounted on a holder as a component of the inkjet head unit. FIG. 3 is a perspective view showing a state where a reinforcing plate is bonded to the printhead shown in FIG. 2.

An inkjet head unit 1 is used in a serial inkjet printer (not shown), and constructed to perform recording by ejecting inks of four colors (cyan, magenta, yellow, and black) onto a recording sheet which is fed in along a sub scanning direction. As shown in FIGS. 1 and 2, the head unit 1 comprises an ink tank 71 in which four compartments 3 for separately storing the four color inks are defined, a printhead 70 disposed below the ink tank 71, and a flexible printed wiring board or a flexible printed circuit board (FPC) 50 attached to the printhead 70.

In the ink tank 71, the four compartments 3 are aligned in a main scanning direction. In FIG. 2, the compartments for the magenta ink, yellow ink, cyan ink, and black ink are arranged in the order of description left to right. The four compartments are connected to ink cartridges (not shown) via tubes 40 as shown in FIG. 1, to be supplied with inks of respective colors in the ink cartridges. The ink tank 71 is attached to a reinforcing plate 14 having a rectangular shape, as shown in FIGS. 2 and 3. This reinforcing plate 14 is bonded with a UV cure adhesive 16 to a holder 72 of a substantially rectangular shape. The reinforcing plate 14 has a rectangular opening 14b formed therethrough as shown in FIG. 3, and is bonded to the printhead 70 such that an actuator unit or piezoelectric actuator 21 described below is disposed in the opening 14b. Four ink outflow channels 3a are formed through a bottom wall of the ink tank 71 to be in communication with the respectively corresponding compartments 3 of the ink tank 71, and four oblong through-holes 14a are formed through the reinforcing plate 14 as shown in FIG. 3, to be in communication with the respectively corresponding ink outflow channels 3a.

Figure 4:
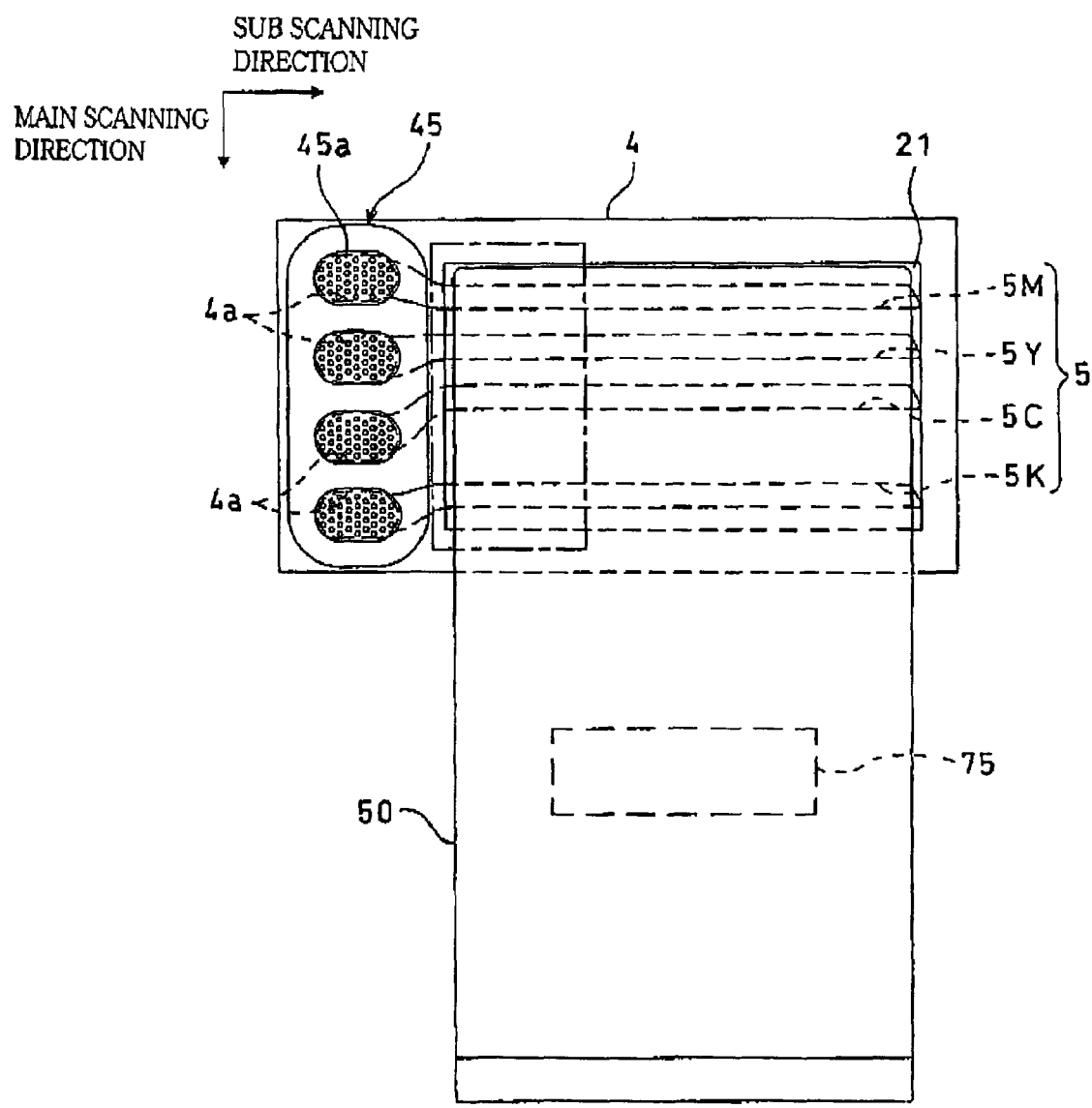
FIG. 4 is a plan view of the printhead shown in FIG. 2.

The printhead 70 comprises a passage unit 4 and the actuator unit 21 and is disposed under the ink tank 71. In the passage unit 4, a plurality of ink passages for the color inks are formed. The actuator unit 21 is bonded to an upper surface of the passage unit 4 with an epoxy thermosetting adhesive. Each of the passage unit 4 and the actuator unit 21 is made up of a plurality of thin layers stacked and bonded to one another. As shown in FIG. 4, four oblong ink supply ports 4a are formed to be open in an upper surface of the passage unit 4. As shown in FIG. 3, the passage unit 4 is bonded to the reinforcing plate 14 such that the through-holes 14a formed through the reinforcing plate 14 are in communication with the respectively corresponding ink supply ports 4a of the passage unit 4. Thus, the four color inks are respectively drawn from the ink tank 71 through the ink outflow channels 3a of the ink tank 71, and supplied to the inside of the passage unit 4 through the ink supply ports 4a of the passage unit 4, via the through-holes 14a of the reinforcing plate 14.

Figure 6:
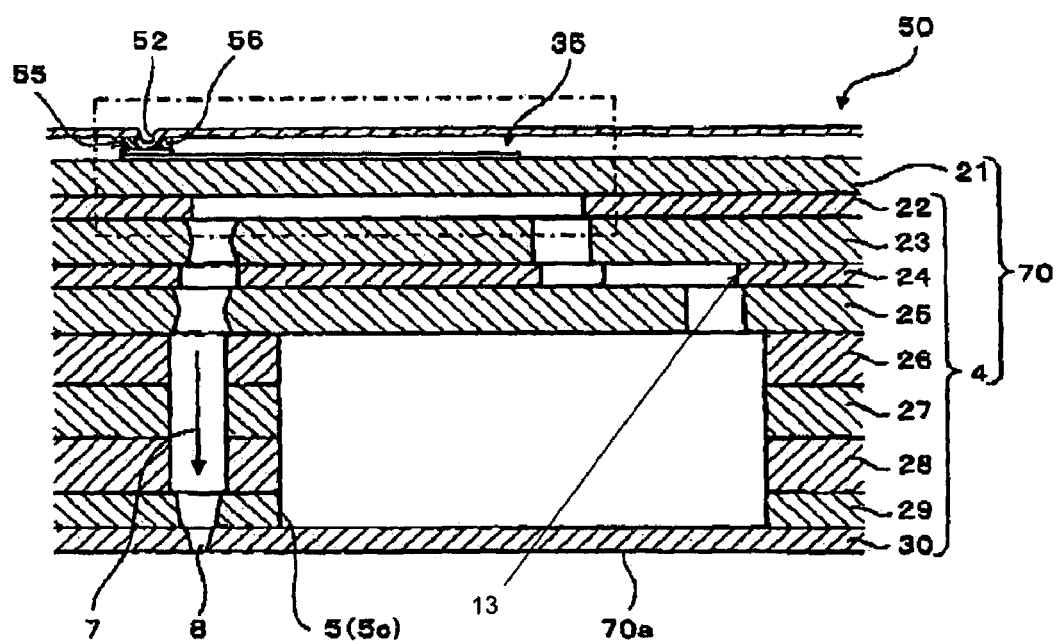
FIG. 6 is a cross-sectional view of the printhead as taken along a line 6-6 in FIG. 5.
Figure 7A:
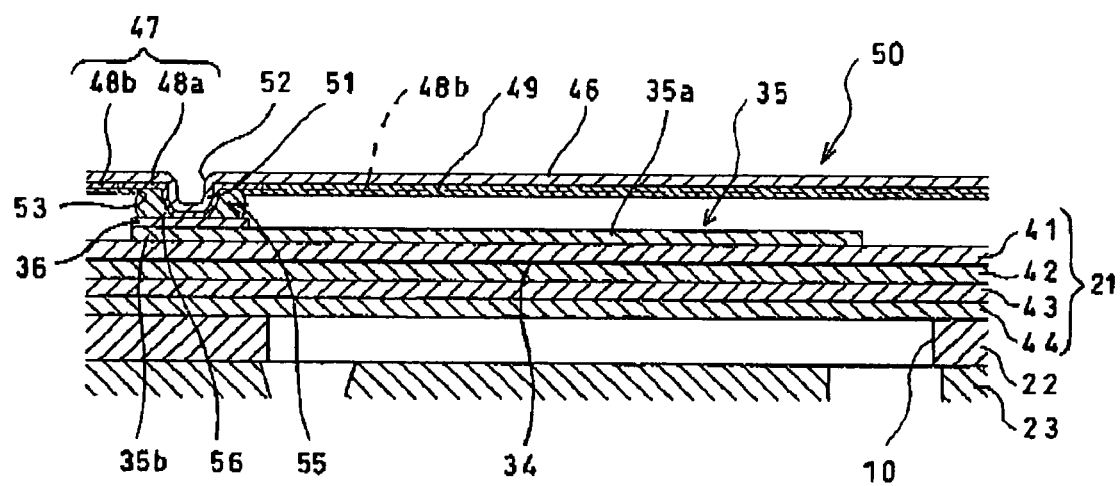

The holder 72 has an opening 72a formed through its bottom wall. The opening 72a has a step in the direction of the thickness of the bottom wall. The passage unit 4 of the printhead 70 is disposed in the stepped opening 72a, spaced from an internal side surface of the stepped opening 72a, with an ink ejection surface 70a of the passage unit 4 exposed to the outside. A clearance between the passage unit 4 and the internal side surface of the stepped opening 72a is filled with a sealing agent 73. The ink ejection surface 70a is constituted by a bottom face of the printhead 70, and multiple nozzles 8 of a minute diameter are arrayed in the ink ejection surface 70a, as shown in FIG. 6. An end of the FPC 50 in the main scanning direction is bonded to an upper surface of the actuator unit 21 with a thermosetting adhesive 56, as shown in FIG. 7A. From the upper surface of the actuator unit 21, the FPC 50 extends upward, by being once bent, through a space on one of two sides of the ink tank 71 that are opposite in the main scanning direction. A protecting layer 54 for protecting the FPC 50 and actuator unit 21 is provided on an upper side of the part of the FPC 50 bonded to the actuator unit 21.

The FPC 50 bonded at its end to the actuator unit 21 further extends along the side of the ink tank 71 with an elastic member 74 such as a sponge material interposed between the FPC 50 and the ink tank 71. A driver IC 75 is disposed on the FPC 50, which is electrically connected to the actuator unit 21 (fully described below) of the printhead 70 such that drive signals outputted from the driver IC 75 are transferred to the actuator unit 21.

As shown in FIG. 2, an opening 72b is formed through a side wall of the holder 72 opposed to the driver IC 75 for releasing heat generated at the driver IC 75. Further, a substantially rectangular heatsink 76 formed of an aluminum sheet is disposed between the driver IC 75 and the part of the side wall of the holder 72 where the opening 72b is formed. The heatsink 76 is in contact with the driver IC 75. By the provision of the heatsink 76 and the opening 72b, heat generated at the driver IC 75 is released well. A sealing agent 77 is disposed inside the opening 72b to seal between the side wall of the holder 72 and the heatsink 76, in order to prevent introduction of any foreign matter such as ink into the head unit 1.

FIG. 4 is a plan view of the printhead 70 having a rectangular flat shape long in the sub scanning direction. As shown in FIG. 4, in the passage unit 4 are formed four manifold channels 5 extending parallel to each other along the longitudinal direction of the passage unit 4. The manifold channels 5 respectively receive the inks from the compartments 3 of the ink tank 71 through the ink supply ports 4a. In the present embodiment, a manifold channel 5M for magenta ink, a manifold channel 5C for cyan ink, a manifold channel 5Y for yellow ink, and a manifold channel 5K for black ink are formed in the order of description from top down as seen in FIG. 4. A filtering member 45 is disposed on the upper surface of the passage unit 4 at a position to cover the ink supply ports 4a. The filtering member 45 comprises filters 45a each having numerous pores and disposed to cover one of the ink supply ports 4a. Hence, foreign particles or the like included in the inks supplied from the ink tank 71 to the passage unit 4 are filtered out by the filters 45a of the filtering member 45.

The actuator unit 21 having a rectangular shape as seen from its upper side, is bonded to a central portion of an upper surface of the passage unit 4, without covering the ink supply ports 4a. A part of the bottom face of the passage unit 4 positionally corresponding to a bonding area between the actuator unit 21 and the passage unit 4 constitutes an ink ejection area across which the numerous nozzles 8 (one of which is shown in FIG. 6) are arrayed. In the passage unit 4, a large number of pressure chambers 10 (one of which is shown in FIG. 6) and voids 60 are formed across the bonding area, arranged in a matrix. In other words, the actuator unit 21 has dimensions capable of covering all the pressure chambers 10 and voids 60.

Figure 5:
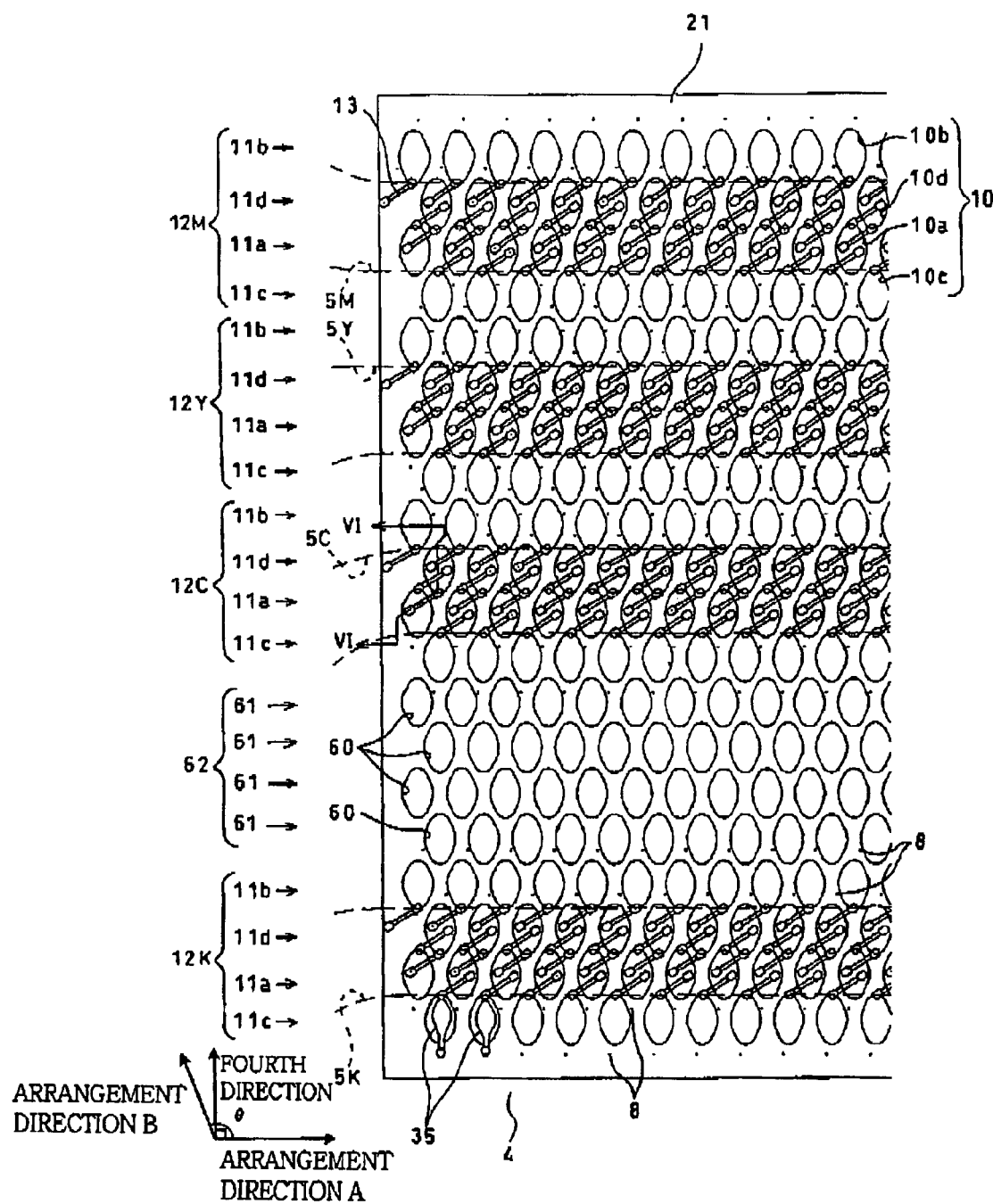
FIG. 5 shows in enlargement a part of the printhead encompassed by a chain line in FIG. 4.

FIG. 5 is an enlarged view of the area encompassed by a chain line in FIG. 4. In the passage unit 4, there are formed 16 pressure-chamber rows 11 each of which consists of a plurality of pressure chambers 10, and four void rows 61 each of which consists of a plurality of voids 60 and extends parallel to the pressure-chamber rows 11. The sixteen pressure-chamber rows 11 is divided into two clusters, namely, a first cluster consisting of 12 rows of them and a second cluster consisting of four rows of them. The first and second clusters of the pressure-chamber rows 11 are disposed on the opposite sides of the void rows 61 as a cluster. As shown in FIG. 5, the pressure chamber 10 and void 60 are identical in shape and size, but not identical in function. However, the numerous pressure chambers 10 and voids 60 are orderly arrayed without distinction in one certain arrangement pattern, in the passage unit 4.

As seen from its upper side, each pressure chamber 10 formed in the passage unit 4 has a substantially rhomboid shape with rounded corners whose major diagonal is parallel to the width direction of the passage unit 4, i.e., the main scanning direction. One of two opposite ends, in the direction of the major diagonal, of each pressure chamber 10 is in communication with one of the nozzles 8, and the other of the opposite ends is in communication with a corresponding one of the manifold channels 5 via an aperture 13. In this way, a large number of individual ink passages 7 (one of which is shown in FIG. 6) are formed to communicate the pressure chambers 10 with the respectively corresponding nozzles 8, while connected to the manifold channels 5. In FIG. 5, to facilitate understanding of the invention, the pressure chambers 10, voids 60, apertures 13, and nozzles 8 are represented by solid lines although these members are inside the passage unit 4 and normally represented by broken lines.

FIG. 6 is a cross-sectional view taken along a line 6-6 in FIG. 5, showing one of the individual ink passages 7. As can be seen in FIG. 6, each nozzle 8 is in communication with a corresponding one of the manifold channels 5 via a corresponding pressure chamber 10 and aperture or orifice 13. That is, there is formed a passage extending from a manifold channel 5 to a nozzle 8 via an aperture 13 and a pressure chamber 10. In this way, an individual ink passage 7 for each pressure chamber 10 is formed in the printhead 70.

The printhead 70 is a laminate of 10 sheet materials, namely, the actuator unit 21, a cavity plate 22, a base plate 23, an aperture plate 24, a supply plate 25, manifold plates 26-29, and a nozzle plate 30, that are superposed on one another in the order of description from top down. Among these sheet materials, nine sheet materials except the actuator unit 21 constitute the passage unit 4.

The actuator unit 21, which will be fully described later, is constituted by four piezoelectric sheets 41-44 (i.e. piezoelectric elements) stacked as shown in FIG. 7. The uppermost one 41 of the four piezoelectric sheet 41-44 has portions each of which functions as an actuating portion upon application of an electric field. It is noted that each actuating portion, its corresponding pressure chamber and nozzle constitute a printing element as a kind of a recording element. The other sheets 42-44 without such an actuating portion function as non-active layers. The cavity plate 22 is a metallic sheet having numerous rhomboid openings that constitute the pressure chambers 10 and voids 60, and are formed across the bonding area at which the passage unit 4 is bonded to the actuator unit 21. The base plate 23 is a metallic sheet having first openings and second openings. Each of the first openings communicates one of the pressure chambers 10 formed in the cavity plate 22 with a corresponding one of the apertures 13, and each of the second openings communicates one of the pressure chambers 10 with a corresponding one of the nozzles 8.

The aperture plate 24 is a metallic sheet having openings constituting the apertures 13 for the respective pressure chambers 10, and openings for communicating the pressure chambers 10 with the respectively corresponding nozzles 8. The supply plate 25 is a metallic sheet having openings for communicating the apertures 13 with the respectively corresponding manifold channels 5, and openings for communicating the pressure chambers 10 with the respectively corresponding nozzles 8. The manifold plates 26-29 are metallic sheets each having openings constituting the manifold channels 5, and openings for communicating the pressure chambers 10 with the respectively corresponding nozzles 8. The nozzle plate 30 is a metallic sheet having openings constituting the nozzles 8 for the respective pressure chambers 10.

The ten sheets and plates 21-30 are stacked, properly positioned relatively to one another to form the individual ink passages 7, one of which is shown in FIG. 6. Each individual ink passage 7 extends from a manifold channel 5 first upward and then horizontally at the aperture 13, and again upward to the pressure chamber 10 where the individual ink passage 7 extends horizontally. The individual passage 7 then extends downward obliquely in a direction away from the aperture 13, to the nozzle 8.

As seen in FIG. 6, the pressure chamber 10 and the aperture 13 are formed at different levels with respect to the stacking of the sheets and plates, that is, formed in different plates. This makes it possible to dispose each aperture 13 in the passage unit 4 opposed to the actuator unit 21, at a position to overlap, as seen from the upper side, another pressure chamber 10 different from the pressure chamber 10 in communication with the each aperture 13, as can be seen in FIG. 5. Accordingly, the pressure chambers 10 can be arranged close to one another, achieving an arrangement in high density. Thus, image printing at a high resolution is made possible even with an inkjet head unit 1 whose ink ejection surface is relatively small.

Referring back to FIG. 5, each pressure chamber 10 is communicated at one of opposite ends of its major diagonal with the nozzle 8, and at the other end of its major diagonal with the manifold channel 5. As will be described later, individual electrodes 35 (shown in FIGS. 7A and 7B) each having a substantially rhomboid shape as seen from the upper side, which is one size smaller than that of the pressure chamber 10, are arranged in a matrix on the upper surface of the actuator unit 21 to positionally correspond to the respective pressure chambers 10. In FIG. 6, only two individual electrodes 35 are presented for simplicity.

The voids 60 are formed in the cavity plate 22 in order to improve uniformity in the rigidity of the cavity plate 22 with respect to the pressure chambers 10. Each void 60 is an opening having the same shape and size as those of the pressure chamber 10 formed in the cavity plate 22, and defined by being covered or closed by the actuator unit 21 and the base plate 23. Thus, the void 60 is neither connected to an ink passage nor filled with the ink. The voids 60 are arranged in a matrix, more specifically, arrayed in a fashion staggered in two arrangement directions, namely, a direction A (a first direction) and a direction B (a second direction). The voids 60 are arranged in four parallel rows 61 together forming a void cluster 62. The pressure chambers 10 are formed in the passage unit 4 with the void cluster 62 interposed between the two clusters of the pressure chambers 10.

In the present embodiment, the pressure chamber 10 and the void 60 are identical in shape and size, and arranged in the same fashion. As a whole, the pressure chambers 10 and voids 60 are arranged in a matrix of the pattern staggered in the arrangement directions A and B. The direction A is parallel to a longitudinal direction of the inkjet head unit 1 or the passage unit 4, and to a minor diagonal of the pressure chamber 10. The arrangement direction B is parallel to an inclined side of the rhomboid shape of the pressure chamber 10, and forms an obtuse angle θ with the arrangement direction A.

The pressure chambers 10 are arranged in a matrix or aligned along the arrangement directions A and B, at intervals in the arrangement direction A which corresponds to an employed degree of resolution. For instance, to have the nozzles arranged in a density to enable printing at a resolution of 150 dpi, the pressure chamber 10 are arranged in a density of 37.5 dpi in the arrangement direction A.

The pressure chambers 10 are arranged within the bonding area between the actuator unit 21 and the passage unit 4 such that 16 pressure chambers 10 are arranged along the arrangement direction B with four voids 60 interposed, and eight pressure chambers 10 are arranged along a fourth direction orthogonal to the arrangement direction A as seen in a third direction which is perpendicular to the surface of the sheet where FIG. 5 is presented, with two voids 60 interposed.

The numerous pressure chambers 10 are arranged in the matrix comprising the pressure-chamber rows 11 each extending in the arrangement direction A as shown in FIG. 5. The pressure-chamber rows 11 are classified into four groups of rows based on their positions relative to the respectively corresponding manifold channels 5 as seen in the third direction. Namely, first row group 11a, second row group 11b, third row group 11c, and fourth row group 11d. The pressure-chamber rows 11 of the first through fourth groups 11a-11d are cyclically arranged in an order of 11c-11a-11d-11b, from one of opposite sides in the width direction of the actuator unit 21 to the other side (i.e., from bottom up as seen in FIG. 5), such that each four rows 11c, 11a, 11d, 11b form a set 12 of pressure-chamber rows 11. Four sets 12 of pressure-chamber rows 11 are thus made, and all the pressure chambers 10 belonging to each set 12 are communicated with one of the manifold channels 5 via the respective apertures 13. That is, each set 12 of the pressure chambers 10 corresponds to one of the manifold channels 5, and accordingly four sets 12M, 12Y, 12C, 12K of the pressure chambers 10 are formed for the respective color inks, so that when the actuator unit 21 changes the inner volume of each pressure chamber 10 belonging to one of the sets 12M, 12Y, 12C, 12K, a droplet of ink of the corresponding color is ejected from the nozzle 8.

Each of the nozzles 8 communicated with the pressure chambers 10a, 10c of the pressure-chamber rows of the first and third groups 11a, 11c, is disposed on the lower left side, in the fourth direction, of the communicated pressure chamber 10a, 10c, or on the left side of a lower end of the pressure chamber 10a, 10c. On the other hand, each of the nozzles 8 communicated with the pressure chambers 10b, 10d of the pressure-chamber rows of the second and fourth groups 11b, 11d, is disposed on the upper right side, in the fourth direction, of the communicated pressure chamber 10, or on the right side of an upper end of the pressure chamber 10. In the pressure-chamber rows 11a, 11d of the first and fourth groups, more than a half of each pressure chamber 10a, 10d overlaps with the manifold channel 5 as seen in the third direction. On the other hand, in the pressure-chamber rows 11b, 11c of the second and third groups, almost an entirety of each pressure chamber 10b, 10c is located outside the manifold channel 5 as seen in the same direction. Thus, it is enabled to smoothly supply the inks to the pressure chambers 10 by widening the manifold channels 5 and preventing all the nozzles 8 communicated with the pressure chambers 10 of rows 11a-11d, from being located under the manifold channels 5.

There will be now described a structure of the actuator unit 21. The multiple individual electrodes 35 are arranged on the actuator unit 21 in a matrix of the same arrangement pattern as the pressure chambers 10. Each individual electrode 35 is disposed at a position to be opposed to a corresponding one of the pressure chambers 10 as seen from the upper side. This orderly arrangement of the pressure chambers 10 and individual electrodes 35 facilitates design of the actuator unit 21.

Figure 7B:
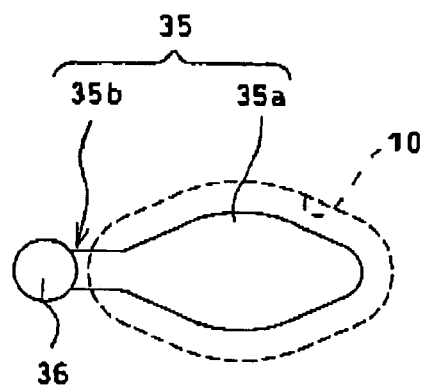
FIG. 7B is a plan view of an individual electrode of the actuator unit.
Figure 8:
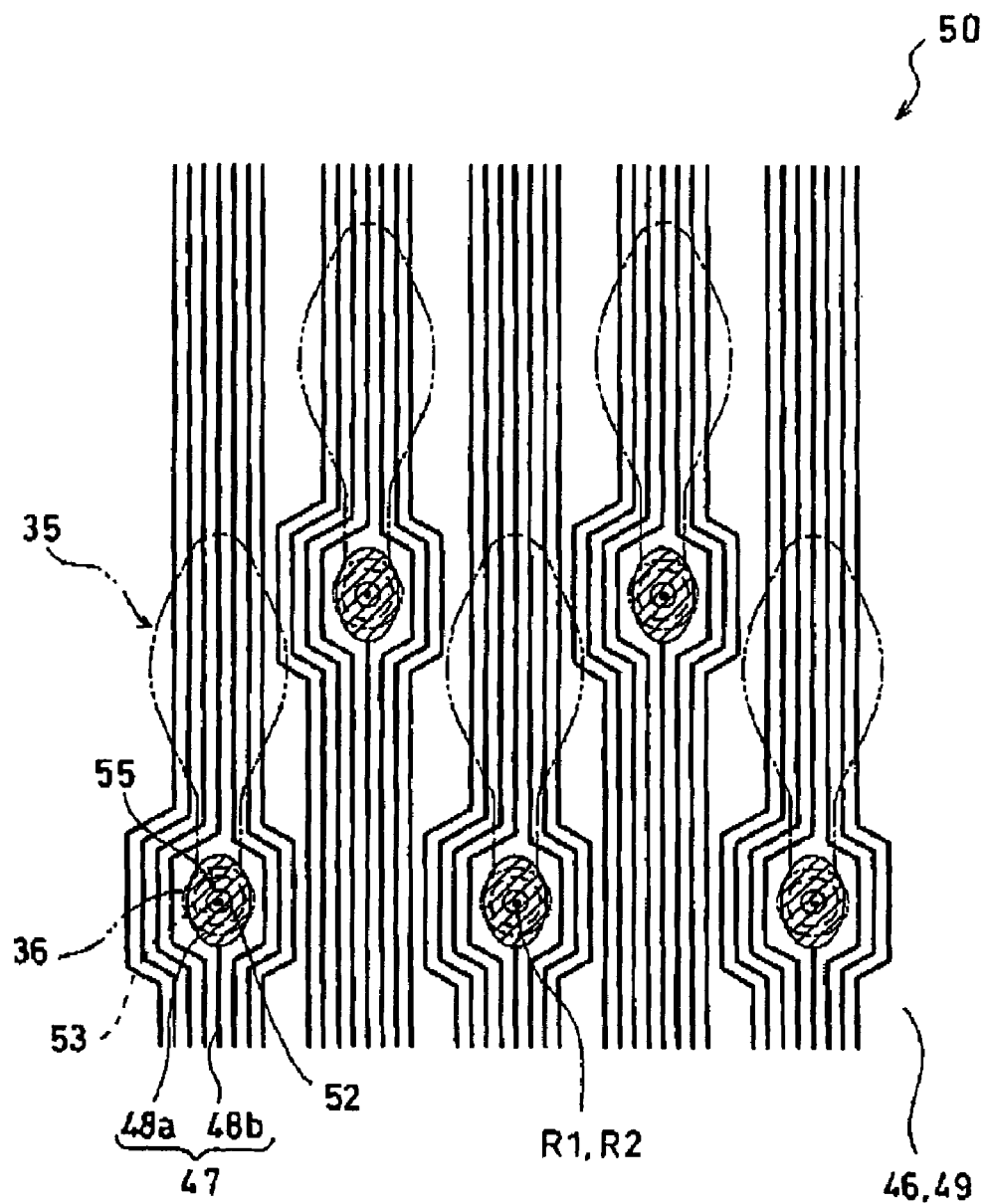
FIG. 8 is an enlarged plan view of an FPC shown in FIG. 2.

FIGS. 7A and 7B show the actuator unit 21. FIG. 7A is an enlarged view of the part encompassed by a chain line in FIG. 6, while FIG. 7B is a plan view of the individual electrode. FIG. 8 is an enlarged plan view of an FPC 50 shown in FIG. 2. In FIG. 8, a terminal 48a and a wire 48b are represented by a solid line for simplicity, although these are inside the FPC 50 and normally represented by a broken line. As shown in FIGS. 7A and 7B, the individual electrodes 35 are disposed at respective positions to be opposed to the pressure chambers 10, and each individual electrode 35 comprises a main electrode portion 35a formed within an area of the corresponding pressure chamber 10 as seen from the upper side, and an auxiliary electrode portion 35b continuous from the main electrode portion 35a and formed outside the area of the pressure chamber 10.

As shown in FIG. 7A, the actuator unit 21 comprises the four piezoelectric sheets 41, 42, 43, 44 each having a thickness of about 15 µm. The piezoelectric sheets 41-44 are continuous flat sheets covering the multiple pressure chambers 10 and voids 60 formed within an area corresponding to the ink ejection area or surface 70a of the printhead 70. Since the piezoelectric sheets 41-44 in the form of continuous flat sheets are disposed to cover the numerous pressure chambers 10, it is enabled to form the individual electrodes 35 on the piezoelectric sheet 41 in a high density, by screen printing for instance. This in turn enables to increase the density of the pressure chambers 10 formed at respective positions corresponding to the individual electrodes 35, realizing printing at a relatively high resolution. The piezoelectric sheets 41-44 are made of a PZT (lead-zirconate-titanate)-based ceramic material having a ferroelectricity.

The main electrode portion 35a of the individual electrode 35 formed on the uppermost piezoelectric sheet 41 has a substantially rhomboid shape almost similar to the shape of the pressure chamber 10, as shown in FIG. 7B. An acute angle portion on the left side, as seen in FIG. 7B, of the rhomboid main electrode portion 35a is extended to an area overlapping an acute angle portion of the pressure chamber 10 and connected to the auxiliary electrode portion 35b. At an end of the auxiliary electrode portion 35b is formed a circular land 86 which is electrically connected to the individual electrode 35. As shown in FIG. 7B, the land 36 is disposed at a position under which a pressure chamber 10 is not present in the cavity plate 22, and has a diameter of about 0.3 mm and a thickness of about 10 µm. The land 36 is formed on the auxiliary electrode portion 35b as shown in FIG. 7B, with gold containing glass frit, for instance.

A common electrode 34 is interposed between the uppermost piezoelectric sheet 41 and the next uppermost piezoelectric sheet 42. The common electrode 84 has the same shape as the piezoelectric sheet 41 and a thickness of about 2 µm. The individual and common electrodes 34, 35 may be formed of a Ag—Pd-based metallic material, for instance.

The common electrode 34 is grounded at a place not shown, so as to be held at a constant potential, namely, the ground potential, uniformly across an area covering all the pressure chambers 10.

As shown in FIG. 7A, the FPC 50 comprises a base film or flexible layer 46, a conductor pattern 47 formed on an undersurface (i.e., the surface opposed to the printhead 70) of the base film 46, and a solder resist or covering layer 49 formed to cover the conductor pattern 47, which are laminated. In the present embodiment, the base film 46 is an electrically insulating film of polyimide resin having a flexibility. However, the base film 46 may be any other electrically insulating resin films; for instance, a resin film of polyethylene, polycarbonate, polystyrene, or polypropylene may be employed. The conductor pattern 47 is formed of copper foil.

As shown in FIG. 8, the conductor pattern 47 comprises a plurality of terminals or conducting layers 48a formed on the base film 46 at respective positions to be opposed to the lands 36, and a plurality of wires 48b each extending from a lower end of one of the terminals 48a downward as seen in FIG. 8, that is, toward an end of the FPC 50 on the side of the driver IC 75. Each of the terminal 48a has an elliptical shape long in the direction of extension of the wires 48b (i.e., the vertical direction in FIG. 8). Since the terminals 48a are formed in such an elliptical shape long in the direction of extension of the wires 48b corresponding to the terminals 48a, a distance between two adjacent wires 48b in the direction perpendicular to the direction of extension of the FPC 50 can be increased. Thus, the wires 48b can be easily formed on the FPC 50. The terminals 48a are plated with gold to ensure a resistance to oxidation and electrical conduction between the terminal 48a and the land 36.

Each of the wires 48b has a width about one tenth of the width, or shorter side, of the terminal 48a. A wire 48b extends from each terminal 48a while electrically connected therewith. The wires 48b are spaced from one another, while circumventing the terminals 48a. The wires 48b are respectively connected to the driver IC 75 disposed at a place on the FPC 50 on the side of a control circuit.

As shown in FIG. 7A and FIG. 8, at the positions in the base film 46 opposed to the respective lands 36, that is, the positions corresponding to the respective terminals 48a, there are formed protrusions 51 each protruding from the undersurface of the base film 46 toward approximately a center of the corresponding land 36. The protrusions 51 are formed by pressing using a punch of a very thin needle with a rounded tip. By forming the protrusions 51 on the underside of the base film 46, there are formed recesses 52 conforming to the shape of the punch, on an upper surface of the base film 46 at the positions corresponding to the protrusions 51. Each of the protrusions 51 or recesses 52 constitutes a protruding portion 55 which protrudes from a central portion of the terminal 48a toward approximately the center of the land 36, as shown in FIG. 7A.

A plurality of circular holes 53 are formed through the solder resist 49 at respective positions to be opposed to the lands 36. Each hole 53 is smaller than the corresponding terminal 48a and located within the area of the terminal 48a as seen from the upper side, and formed to not cover the corresponding protrusion 51, allowing the protrusion 51 to protrude through the hole 53. Each hole 53 is positioned such that its center R1 and a center R2 of the corresponding terminal 48a are aligned. Hence, a part of the solder resist 49 around each hole 53 covers a peripheral portion or edge of the corresponding terminal 48a over an entire circumference of the edge, while all the wires 48b are covered by the other part of the solder resist 49. In other words, the conductor pattern 47 is exposed to the outside at and around the protruding portions 55 of the terminals 48a.

As shown in FIG. 7A, the epoxy thermosetting adhesive 56 is applied around the protruding portion 55 which protrudes through the hole 53. An end of the protruding portion 55 is brought into contact with the surface of the land 36 and flattened by a shrinkage force generated upon curing of the adhesive 56, and also by the cohesion of the adhesive 56 with respect to the land 36. In this way, the terminal 48a and the land 36 are electrically connected. According to this arrangement, the FPC 50 can transmit a drive signal from the driver IC 75 to each of the individual electrodes 35 via the corresponding wire 48b and terminal 48a. That is, each of the individual electrodes 35 is connected to the driver IC 75, via the terminal 48a and wire 48b exclusively for that individual electrode 35 and independent of the terminals 48a and wires 48b for the other individual electrodes 35. Thus, it is enabled to control ink ejection related to each pressure chamber independently of the other pressure chambers.

It is noted that the way of connecting the terminals 48a to the lands 36 is not limited to the bonding as mentioned above, but the contact between the terminals 48a and the lands 36 may be ensured by any other methods. For instance, a member or device pressing the FPC 50 against the actuator unit 21 for maintaining the contact therebetween may be employed.

Next, there will be described a method of driving the actuator unit 21. The direction of polarization of the piezoelectric sheet 41 of the actuator unit 21 is parallel to the direction of thickness thereof. That is, the actuator unit 21 is of unimorph type where the uppermost one 41 of the piezoelectric sheets 41-44 (i.e., the one most remote from the pressure chamber 10) is formed to include actuating portions while the other piezoelectric sheets 42-44 on the lower side (i.e., the three closer to the pressure chamber 10) are not an active layer. Hence, where the directions of the electric field and the polarization are aligned and when the electric potential of a given positive or negative value is imposed at the individual electrode 35, the portion in the piezoelectric sheet 41 where the electric field is applied functions as an actuating portion (or pressure generating portion), causing the actuator unit 21 to contract in a direction perpendicular to the polarization direction by the piezoelectric transversal effect.

In the present embodiment, the portion in the piezoelectric sheet 41 interposed between each individual electrode 35 and the common electrode 34 serves as an actuating portion for deforming the actuator unit 21 upon application of an electric field due to the piezoelectric effect. On the other hand, the three piezoelectric sheets 42-44 below the piezoelectric sheet 41 are not applied with the electric field from the outside, and substantially do not serve as an actuating portion. Accordingly, the piezoelectric sheet 41 contracts mainly at the portion interposed between each main electrode portion 35a of the individual electrode 35 and the common electrode 34 in the direction perpendicular to the polarization direction by the piezoelectric transversal effect.

Since the piezoelectric sheets 42-44, which are not affected by the electric field, do not spontaneously deform, a difference in an amount of deformation in the direction perpendicular to the polarization direction occurs between the uppermost piezoelectric sheet 41 and the piezoelectric sheets 42-44 thereunder, making the laminate of the piezoelectric sheets 41-44 convex as a whole to the side of the piezoelectric sheets 42-44, which are non-active layers. That is, a unimorph deformation occurs. Since the undersurface of the actuator unit 21 comprising the piezoelectric sheets 41-44 is fixed to the upper surface of a partition wall or the cavity plate 22 having the through-holes constituting the pressure chambers 10, as shown in FIG. 7A, the laminate of the piezoelectric sheets 41-44 deforms to be convex toward the pressure chamber 10 in question. Thus, the inner volume of the pressure chamber 10 decreases, raising the ink pressure there and accordingly ejecting the ink from the corresponding nozzle 8. Thereafter, the electric potential at the individual electrode 35 is restored to its original value which is the same as that of the common electrode 34, with the laminate of the piezoelectric sheets 41-44 restored to its original shape, which in turn restores the inner volume of the pressure chamber 10 to its original value, thereby sucking the ink from the manifold channel 5.

There may be employed another driving method, such that the potential at the individual electrode 35 is normally set at a value different from that at the common electrode 34, and each time a request for ejection is received, the potential at the individual electrode 35 is once made the same as that of the common electrode 34, and then, at a suitable timing, returned to the initial value different from the potential of the common electrode 34. According to such a driving method, when the laminate of the piezoelectric sheets 41-44 is restored to its original shape at the timing when the electrical potentials at the common and individual electrodes 34, 35 are made equal, the inner volume of the pressure chamber 10 increases compared to that in the initial state where the electrical potentials at the common and individual electrodes 34, 35 are different from each other. Thus, the pressure chamber 10 sucks the ink from the manifold channel 5. Then, at the timing when the potential at the individual electrode 35 is again differentiated from that of the common electrode 34, the laminate of the piezoelectric sheets 41-44 are deformed to be convex toward the pressure chamber 10, raising the ink pressure in the pressure chamber 10 due to the decreased inner volume of thereof, and accordingly ejecting the ink. In this way, the inks are ejected from the nozzles 8 while the inkjet head unit 1 is appropriately moved in the main scanning direction, to print a desired image on the recording sheet.

According to the above-described FPC 50 of the inkjet head unit 1, each terminal 48a is long in the direction of extension of the wires 48b. Hence, the terminal 48a does not tend to separate from the base film 46 when the protrusion 51 is formed. More specifically, the upper surface of the FPC 50 where the protruding portions 55 have not been formed yet is subjected to punch pressing, to form the protruding portions 55 in the FPC 50. In this process, a tensile force is imparted to the bonding surface between each terminal 48a and the base film 46 due to the deformation upon forming the protruding portion 55, separating the terminal 48a from the base film 46. In the present embodiment, however, opposite longitudinal ends of the terminal 48a are extending to positions relatively remote from the position at which the protruding portion 55 is formed, making the terminal 48a tend not to separate from the base film 46. Thus, the bond between the base film 46 and the terminal 48a is ensured. In addition, since the edge of each terminal 48a is covered by a part of the solder resist 49 around the hole 53, the bond between the base film 46 and the terminal 48a is enhanced. In this way, the separation of the terminal 48a off the base film 46 upon formation of the protruding portion 55 in each terminal 48a of the FPC 50 can be prevented. Accordingly, there can be obtained the inkjet head unit 1 where each terminal 48a of the FPC 50 is inhibited from separating from the base film 46 upon formation of the protruding portion 55 in the each terminal 48a. That is, production of the inkjet head unit 1 is made easier.

The FPC 50 according to the first embodiment is such that the part of the solder resist 49 around each of its holes 53 covers the edge of the terminal 48a over the entire circumference of the terminal 48a. However, the FPC may have other forms.

Figure 9:
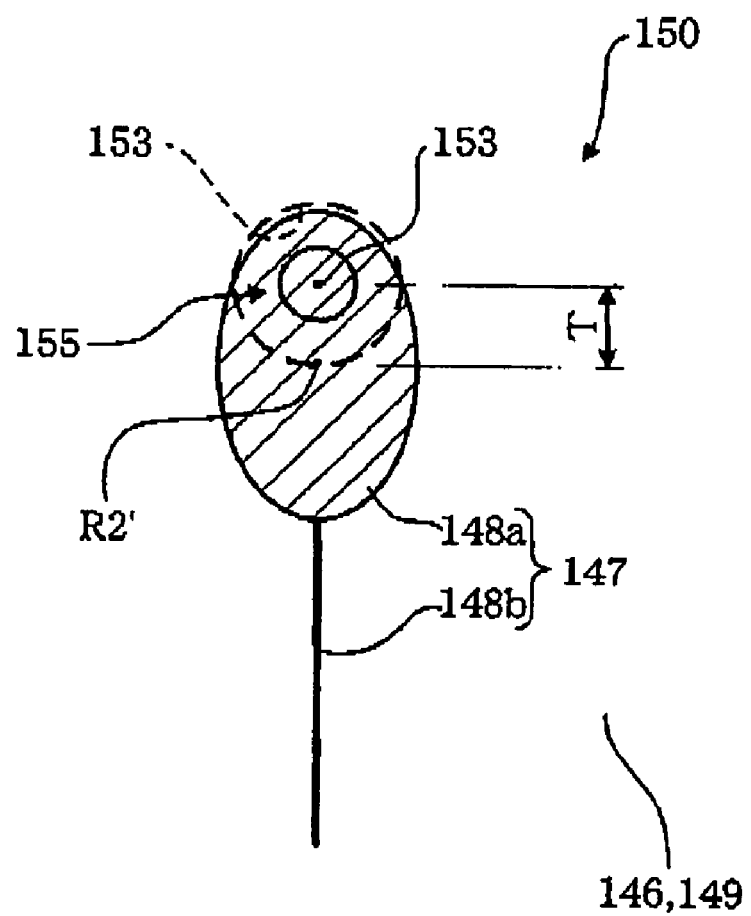
FIG. 9 is a plan view showing in enlargement a part of a flexible flat cable included in an inkjet head unit according to a second embodiment of the invention.

FIG. 9 is a plan view showing in enlargement an FPC 150 according to a second embodiment of the invention. In the FPC 150, a center R1' of each of holes 153 of a solder resist 149 is deviated upward from a center R2' of a terminal 148a by a distance T, as shown in FIG. 9 and such that an extreme upper end of the terminal 148a is not covered by the solder resist 149. However, in this arrangement where the hole 153 is deviated from the center R2' of the terminal 148a by the distance T, the solder resist 149 still covers more than a half of the terminal 148a as seen from the upper side, inhibiting the terminal 148a from separating from a base film 146. Further, since the terminal 148a has an elliptical shape long in the direction of extension of wires 148b, as long as the amount of deviation of the center R1' of the hole 153 from the center R2' as seen from the upper side is smaller than the distance T, most of the edge of the terminal 148a is covered by the solder resist 149, succeeding in inhibiting the terminal 148a from separating from the base film 146. Hence, there is allowed a relatively wide tolerance for position accuracy of the holes 153, facilitating the production of the FPC 150.

Figure 10:
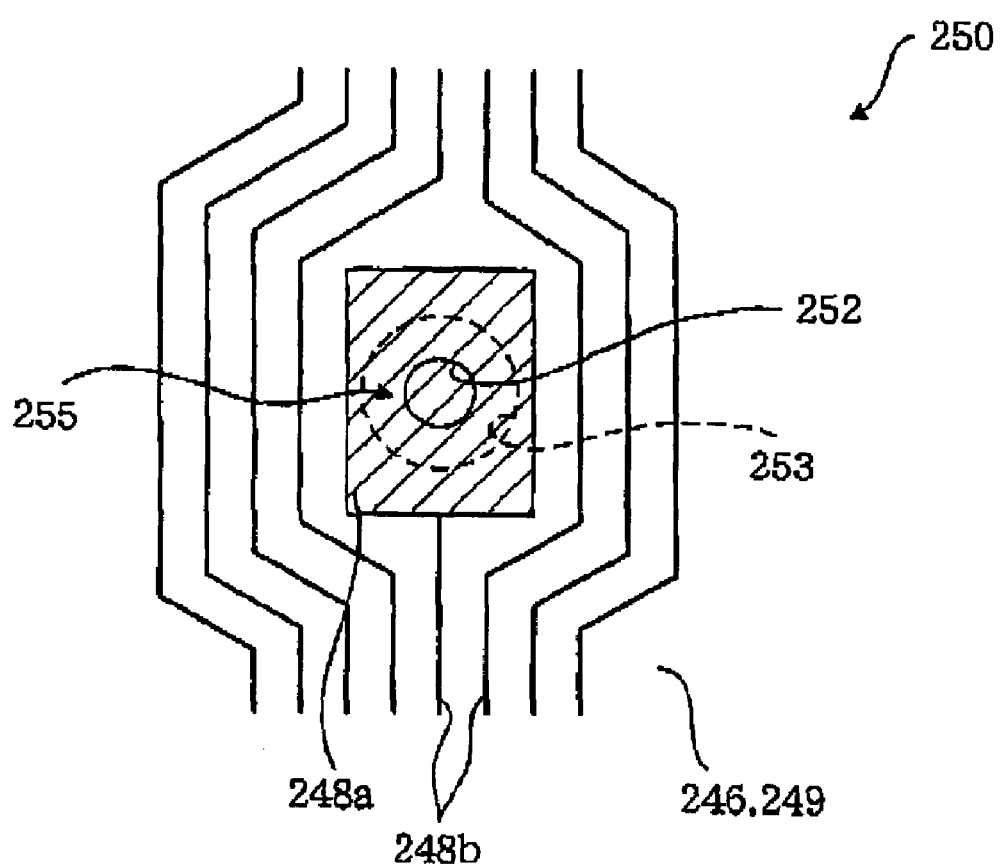
FIG. 10 is a plan view showing in enlargement a part of a flexible flat cable included in an inkjet head unit according to a third embodiment of the invention.
Figure 11:
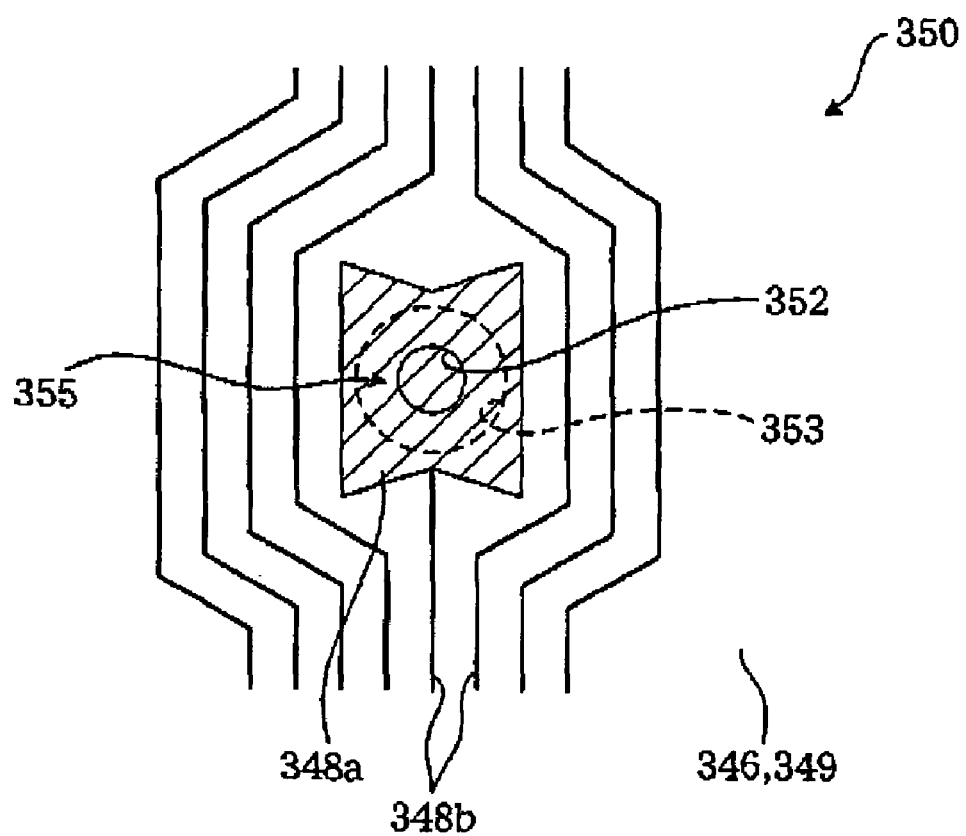
FIG. 11 is a plan view showing in enlargement a part of a flexible flat cable included in an inkjet head unit according to a fourth embodiment of the invention.

Although the terminal 48a of the FPC 50 according to the first embodiment has an elliptical shape, the shape of the terminal may be otherwise. FIGS. 10 and 11 show examples of FPCs where each terminal is not elliptical in shape. More specifically, FIG. 10 is an enlarged plan view of an FPC 250 according to a third embodiment of the invention, while FIG. 11 is an enlarged plan view of an FPC 350 according to a fourth embodiment of the invention. In the FPC 250 of the third embodiment as shown in FIG. 10, a terminal 248a has a rectangular shape long in a direction of extension of wires 248b, as seen from the upper side. Meanwhile, in the FPC 350 of the fourth embodiment as shown in FIG. 11, a terminal 348a has a polygonal shape generally long in the direction of extension of wires 348b. At each of opposite longitudinal ends of the polygonal terminal 348a is formed a shallow V-shaped recess, thereby forming four acute corners. The FPCs 250, 350 of the third and fourth embodiments are different from the FTC 50 of the first embodiment only in shape of the terminal as seen from the upper side, and the other part of the FPCs 250, 350 is identical with the FPC 50 of the first embodiment.

Since the terminal 248a, 348a also has a shape long in the direction of extension of the wires 248b, 348b, the same effects as the first embodiment can be obtained according to the third and fourth embodiments. In addition, since it is ensured that the four corners of the terminal 248a, 348a which are located outside a circular hole 253, 353 of a solder resist 249, 349 is covered by the solder resist 249, 349, separation of the terminals 248a, 348a from a base film 246, 346 is effectively prevented. In the third and fourth embodiments, even when the center of the terminal 248a, 348a is deviated from the center of the hole 253, 353 by the distance T as in the second embodiment, the four corners of the terminal 248a, 348a are still covered by the solder resist 249, 349, and the separation of the terminal 248a, 348a from the base film 246, 346 is effectively prevented.

Figure 12:
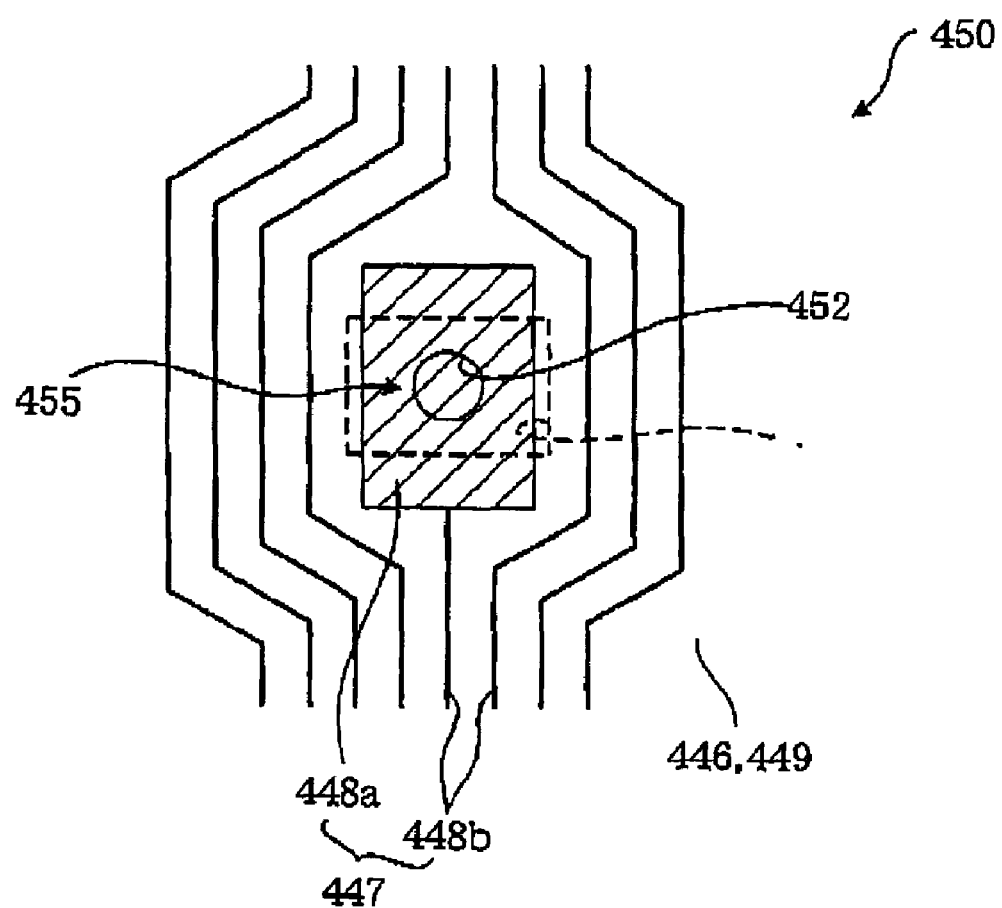
FIG. 12 is a plan view showing in enlargement a part of a flexible flat cable included in an inkjet head unit according to a fifth embodiment of the invention.

The solder resist may take any form as long as covering at least a part of an edge of each terminal in the circumferential direction of the terminal. An example of such a solder resist is employed in an FPC 450 according to a fifth embodiment of the invention as shown in FIG. 12. In the fourth embodiment, a terminal 448a has a rectangular shape long in a direction of extension of wires 448b, as seen from the upper side. Holes 453 are formed through the solder resist 449 such that a recess 452 is positioned at a center of each of the holes 453. The hole 453 has a substantially rectangular shape whose four edges or sides are parallel to respectively corresponding sides of the terminal 448a. Among the sides of the hole 453, two sides parallel to the longer sides of the terminal 448a are shorter than these longer sides of the terminal 448a. Hence, both of opposite longitudinal ends of the terminal 448a are covered by the solder resist 449, enabling to form protruding portions 455 in the FPC 450 without suffering from separation of the terminals 448a from a base film 446.

Whether the length of the shorter sides of the terminal 448a is smaller or larger than the length of the sides of the hole 453 parallel to the shorter sides of the terminal 448a is determined depending on the density in which wires 448b are arranged, and on a required exposed surface area of the terminal 448a at which each terminal 448a is exposed to the outside through the hole 453. Meanwhile, it is preferable that two sides of the hole 453 parallel to the longer sides of the terminal 448a are positioned as close as possible to the longer sides of the terminal 448a, in order to prevent oxidation at a surface of a conductor pattern 447 and occurrence of a short circuit between each terminal 448a and its adjacent wires 448b in the conductor pattern 447.

As apparent from the above description of each embodiment of the invention, the arrangement where at least a part of the terminal 48a, 148a, 248a, 348a, 448a of the individual electrode 35 is covered by the solder resist 49, 149, 249, 349, 449 can prevent separation of the terminal 48a, 148a, 248a, 348a, 448a from the base film 46, 146, 246, 346, 446 more reliably, compared to an arrangement where the solder resist 49, 149, 249, 349, 449 or a layer having the same configuration as the solder resist 49, 149, 249, 349, 449 is not provided. Further, in the arrangement of the first through fourth embodiments where at least one of opposite ends of the terminal 48a, 148a, 248a, 348a is covered by the solder resist 49, 149, 249, 349, the effect of preventing the separation of the terminal is further enhanced. According to the arrangement of the first, third and fourth embodiments where the edge of the terminal 48a, 248a, 348a is covered by the solder resist 49, 249, 349 over an entire circumference thereof, the effect of preventing the separation of the terminal is still further enhanced.

Although the presently preferred embodiments of the invention have been described above, the invention is not limited to the details of these embodiments, but may be embodied with various modifications, without departing from the scope of the invention. For instance, although the FPC according to each of the embodiments of the invention comprises a solder resist, the solder resist may be omitted as long as the terminal of an individual electrode is long in the direction of extension of the wire extending from the individual electrode. Further, the FPC according to the present invention is applicable to any apparatus requiring an FPC for signal transmission.

What is claimed is:

1. A printed wiring board comprising:
an electrically insulating flexible layer which has on one of its opposite sides a protrusion which forms a corresponding recess on the other side of the flexible layer;
an electrically conducting layer formed on the protrusion;
a wire formed on the flexible layer, connected to the conducting layer, and extending in a direction; and
the conducting layer having a shape long in the direction of extension of the wire that includes a plurality of corners and a recess formed between the plurality of corners at a longitudinal end of the conducting layer.

2. The printed wiring board according to claim 1, wherein the shape of the conducting layer is such that a length of a longer side thereof is at least 1.1 times a length of a shorter side thereof.

3. The printed wiring board according to claim 1, wherein the shape of the conducting layer is such that a length of a longer side thereof is at least 1.2 times a length of a shorter side thereof.

4. The printed wiring board according to claim 1, wherein the shape of the conducting layer is such that a length of a longer side thereof is at least 1.3 times a length of a shorter side thereof.

5. The printed wiring board according to claim 1, wherein the shape of the conducting layer is such that a length of a longer side thereof is at least 1.4 times a length of a shorter side thereof.

6. The printed wiring board according to claim 1, further comprising a covering layer which covers at least a part of the conducting layer.

7. The printed wiring board according to claim 6, wherein the covering layer is a solder resist.

8. The printed wiring board according to claim 6, wherein the covering layer covers at least one of two ends of the conducting layer which are opposite in the direction of extension of the wire.

9. The printed wiring board according to claim 6, wherein the covering layer covers a peripheral portion of the conducting layer over an entire circumference thereof.

10. The printed wiring board according to claim 1, wherein the conducting layer has a polygonal shape, long in the direction of extension of the wire, that includes a shallow V-shaped recess at each of opposite ends of the conducting layer in the direction of extension of the wire and four corners each having an angle smaller than a right angle.

11. The printed wiring board according to claim 1, wherein the conducting layer includes the plurality of corners and the recess formed between two of the plurality of corners adjacent in a direction intersecting the direction of extension of the wire at a longitudinal end of the conducting layer.

12. An electric device comprising:
an actuator unit which includes a plurality of electrodes formed thereon; and
a printed wiring board comprising:
an electrically insulating flexible layer which has on one of its opposite sides a plurality of protrusions which form a plurality of corresponding recesses on the other side of the flexible layer;
a plurality of electrically conducting layers formed on the respective protrusions;
a plurality of wires formed on the flexible layer, connected to the respective conducting layers, and extending in a direction; and
each of the conducting layers having a shape long in the direction of extension of the wires that includes a plurality of corners and a recess formed between the plurality of corners at a longitudinal end of the conducting layer.

13. The electric device according to claim 12, wherein the printed wiring board further comprising a covering layer which covers at least a part of each of the conducting layers.

14. The electric device according to claim 12, wherein the conducting layers of the printed wiring board are respectively connected to the electrodes of the actuator unit by bonding.

15. The electric device according to claim 12,
wherein the actuator unit constitutes a recording head that includes a plurality of recording elements, and the electrodes are formed at respective positions corresponding to the recording elements.

16. The electric device according to claim 15,
wherein the recording head is a printhead and the recording elements are a plurality of printing elements, and the electrodes are formed at respective positions corresponding to the printing elements.

17. The electric device according to claim 16,
wherein the printhead is an inkjet printhead and the printing elements are a plurality of sets each comprising an actuating portion, a pressure chamber, and a nozzle, and the electrodes are formed at respective positions corresponding to the sets.

18. The electric device according to claim 12,
wherein the actuator unit comprises a plurality of actuating portions which are deformable.

19. The electric device according to claim 18,
wherein the actuator unit includes a plurality of piezoelectric elements as stacked, and the electrodes are formed on an outermost one of the piezoelectric elements.

20. The electric device according to claim 12,
wherein the actuator unit deforms when operated by application of a voltage to the electrodes.

21. The printed wiring board according to claim 12,
wherein each of the conducting layers includes the plurality of corners and the recess formed between two of the plurality of corners adjacent in a direction intersecting the direction of extension of the wires at a longitudinal end of the conducting layers.

* * * * *